(12) United States Patent
Hu et al.

(10) Patent No.: US 10,447,959 B2
(45) Date of Patent: Oct. 15, 2019

(54) POWER OVER DATA LINE (PODL) BOARD DESIGN METHOD TO IMPROVE DATA CHANNEL PERFORMANCE

(71) Applicant: Waymo LLC, Mountain View, CA (US)

(72) Inventors: Huihui Hu, Mipitas, CA (US); Min Wang, Santa Clara, CA (US)

(73) Assignee: Waymo LLC, Mountain View, CA (US)

( * ) Notice: Subject to any disclaimer, the term of this patent is extended or adjusted under 35 U.S.C. 154(b) by 164 days.

(21) Appl. No.: 15/817,976

(22) Filed: Nov. 20, 2017

(65) Prior Publication Data

US 2019/0158773 A1 May 23, 2019

(51) Int. Cl.
| | |
|---|---|
| H04B 3/54 | (2006.01) |
| H04N 5/38 | (2006.01) |
| H05K 1/11 | (2006.01) |
| H05K 1/02 | (2006.01) |
| H05K 3/40 | (2006.01) |
| G01S 7/00 | (2006.01) |
| G01S 17/02 | (2006.01) |
| H05K 1/16 | (2006.01) |
| H04L 5/14 | (2006.01) |

(52) U.S. Cl.
CPC ............... *H04N 5/38* (2013.01); *G01S 7/003* (2013.01); *H04B 3/548* (2013.01); *H05K 1/025* (2013.01); *H05K 1/111* (2013.01); *H05K 3/4007* (2013.01); *G01S 17/023* (2013.01); *H04L 5/14* (2013.01); *H05K 1/162* (2013.01); *H05K 1/165* (2013.01); *H05K 2201/1003* (2013.01); *H05K 2201/10015* (2013.01); *H05K 2201/10121* (2013.01); *H05K 2201/10151* (2013.01); *H05K 2201/10356* (2013.01)

(58) Field of Classification Search
CPC ...................................................... H04B 3/548
See application file for complete search history.

(56) References Cited

U.S. PATENT DOCUMENTS

2005/0195583 A1* 9/2005 AbuGhazaleh ...... H05K 1/0228
361/780
2007/0052492 A1 3/2007 Duan et al.
(Continued)

FOREIGN PATENT DOCUMENTS

WO 2017164890 A1 9/2017

OTHER PUBLICATIONS

Thorlabs.com—Multimode Fiber Optic Rotary Joint Patch Cables, Case 3:17-cv-00939-WHA, Document 310-4, Filed Apr. 28, 2017, 12 pages.
(Continued)

*Primary Examiner* — Fritz M Fleming
(74) *Attorney, Agent, or Firm* — Botos Churchill IP Law

(57) ABSTRACT

Aspects of the disclosure provide for a system for a power over data line (PoDL) system. The system includes a ground plane that has a cutout. In addition, an alternating current (AC) capacitor pad configured to establish a bidirectional data channel. The AC capacitor pad is positioned in the cutout of the ground plane. Similarly, a PoDL pad connected to one or more inductors and a direct current (DC) power source is positioned in the cutout of the ground plane and is in series with the AC capacitor pad.

20 Claims, 5 Drawing Sheets

(56) References Cited

U.S. PATENT DOCUMENTS

| | | | |
|---|---|---|---|
| 2012/0069874 A1* | 3/2012 | Tsai | G06F 1/26 375/219 |
| 2013/0230113 A1* | 9/2013 | Herzog | H04B 3/548 375/258 |
| 2013/0301745 A1* | 11/2013 | Maniktala | H04B 3/56 375/258 |
| 2014/0300190 A1* | 10/2014 | Weber | H02J 11/00 307/31 |
| 2015/0222125 A1 | 8/2015 | Brunker | |
| 2015/0295735 A1 | 10/2015 | Gardner | |
| 2016/0054777 A1 | 2/2016 | Dwelley et al. | |
| 2016/0308683 A1 | 10/2016 | Pischl et al. | |
| 2017/0093230 A1 | 3/2017 | Yundt et al. | |
| 2017/0194928 A1 | 7/2017 | Xu et al. | |
| 2017/0272260 A1 | 9/2017 | Han et al. | |
| 2019/0089411 A1* | 3/2019 | Olmstead | H04B 3/56 |

OTHER PUBLICATIONS

International Search Report and Written Opinion for Application No. PCT/US2018/061535 dated Mar. 4, 2019.

\* cited by examiner

100

200

300

500

POWER OVER DATA LINE (PODL) BOARD DESIGN METHOD TO IMPROVE DATA CHANNEL PERFORMANCE

BACKGROUND

Data and power may be transmitted along the same line in power over data lines (PoDLs). PoDLs are sometimes used in various computer applications, such as server computing systems, vehicle control systems, imaging systems, etc. to minimize wiring and reduce costs. In some instances, PoDLs may include a full duplex, or bi-directional, data channel and a direct current (DC) power channel.

BRIEF SUMMARY

Aspects of the disclosure provide for a system. The system includes a ground plane, an alternating current (AC) capacitor pad, and a PoDL pad. The ground plane includes a cutout. The AC capacitor pad is configured to establish a bi-directional data channel and is positioned in the cutout of the ground plane. The PoDL pad is connected to a plurality of inductors and a DC power source. In addition, the PoDL pad is positioned in the cutout of the ground plane and is in series with the AC capacitor pad.

In one example, the system also includes the DC power source. The system also optionally includes a cable connecting the AC capacitor pad and the PoDL pad in series. In this example, the cutout of the ground plane is located between a first end of the cable and a second end of the cable. Also in this example, the system can also includes one or more computing devices at the first end of the cable, where the one or more computing devices are configured to transmit data at a rate of 4 Gbps or greater along the bi-directional data channel. The one or more computing devices, in some implementations, are a serializer.

The system that includes the cable and the cutout also optionally includes one or more computing devices at the second end of the cable. In this example, the one or more computing devices are configured to process data received via the bi-directional data channel. Also in this example, the one or more computing devices are a deserializer. In other implementations of the system that includes the cable and the cutout, the cutout optionally has a size wherein an impedance at the AC capacitor pad and the PoDL pad within the cutout match or closely match an impedance at a point of the cable that is between the first end of the cable and the cutout.

In another example, the cutout has a size wherein an impedance at the AC capacitor pad and the PoDL pad within the cutout match or closely match an impedance at a point of the cable that is between the cut out and the second end of the cable. The system additionally or alternatively includes a camera system configured to collect an image and transmit the image via the AC capacitor pad. In this example, the system also includes a vehicle, and wherein the camera system is mounted on the vehicle. The system optionally includes a lidar system configured to collect location information and transmit the location information via the AC capacitor pad. The system in this example optionally also includes a vehicle, where the lidar system is mounted on the vehicle. In yet another example, the system also includes a layer beneath the ground plane, wherein the AC capacitor pad and the PoDL pad are positioned on the layer within the cutout of the ground plane.

Other aspects of the disclosure provide for a method of manufacturing. The method of manufacturing includes forming a cutout in a ground plane, positioning in the cutout an AC capacitor pad configured to establish a bi-directional data channel, and positioning, in the cutout, a PoDL pad in series with the AC capacitor pad on a cable and in connection with a plurality of inductors and a DC power source.

In one example, the method also includes connecting a first end of the cable to a first computing device and a second end of the cable to a second computing device. In this example, the cutout is positioned between the first end and the second end of the cable. The first computing device in this example is optionally a serializer, and the second computing device in this example is optionally a deserializer. Additionally or alternatively, the cutout has a size wherein an impedance at the AC capacitor pad and the PoDL pad within the cutout match or closely match an impedance at a point of the cable that is between the first end of the cable and the cutout. In another example, the cutout has a size wherein an impedance at the AC capacitor pad and the PoDL pad within the cutout match or closely match an impedance at a point of the cable that is between the cutout and the second end of the cable.

DETAILED DESCRIPTION

Overview

The technology relates to PoDL system for full duplex application. A full duplex application is one in which data may be transmitted bi-directionally between two locations and may be useful for transmitting large amounts of data between devices at high speeds. As an example, a mobile image capture device may include one or more cameras mounted on a vehicle, such as a passenger car, which draw power from a power source of the vehicle using a PoDL. In this case, the PoDL configured for full duplex application may also be used to transmit high-resolution images collected by the mobile image capture device to another device for storage and/or processing in real time. Other applications related to vehicles including, for instance, autonomous vehicles, may include a radar or lidar sensor sending data over the PoDL to a processing device as well as a user interface computing device sending multimedia data over the PoDL to the display monitor for passengers.

As an example, a PoDL system may include a cable that carries a power channel and a data channel. The cable provides the power and data line in the PoDL system. A first pad may be positioned along the cable and on a first physical layer. Additionally, a second pad may be positioned along the cable in series with the first pad and on a same physical layer as the first pad. There may be a cutout in a second physical layer that is on a side of the first physical layer opposite the side on which the first pad and/or the second pad are positioned. This cutout may adjust the impedance at the first pad and/or the second pad to be closer to the impedance before and after the first pad and/or the second pad.

The features described herein may provide a circuit that provides low impedance at for non-alternating currents, but a higher impedance for alternating currents. Furthermore, the circuit may reduce electromagnetic interference and, as a result, may meet the data channel electrical specifications, such as return loss, insertion loss, and crosstalk. The circuit may therefore be used to reduce wiring in systems used for transferring larger amounts of data at a high rate, such as 4 Gbps. The reduced wiring in these systems may significantly simplify the wiring required and allow for more freedom of movement in sensor systems which involves sensors which may be in motion while collecting and transmitting data.

Example Systems

Figure 1:
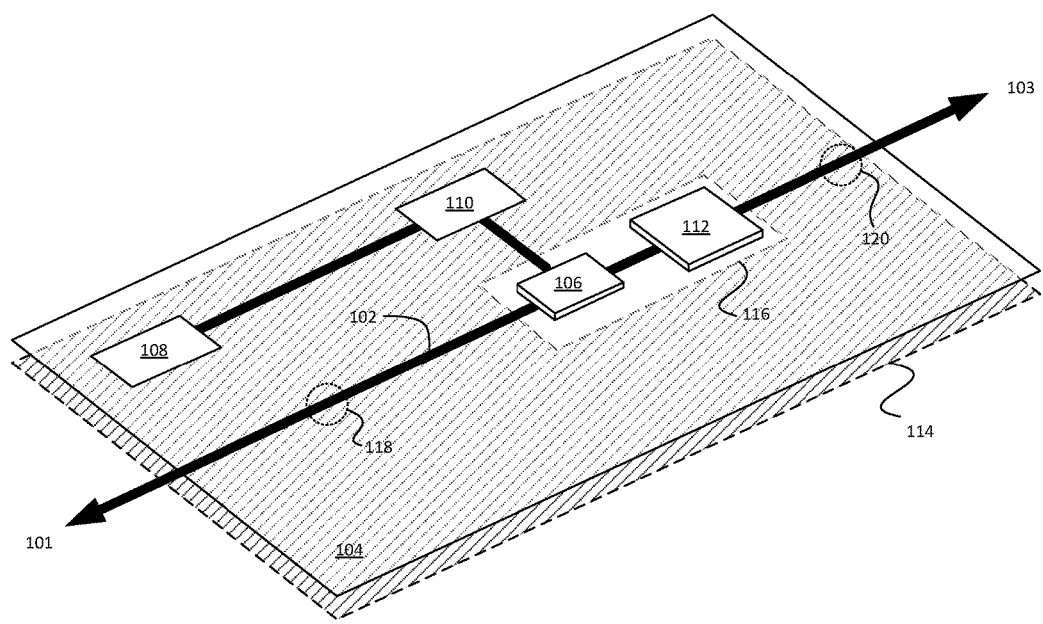
FIG. 1 is a pictorial diagram of an example PoDL system 100 in accordance with aspects of the disclosure.

FIG. 1 shows an example PoDL system 100. The PoDL system 100 includes a cable 102 that carries a power channel and a bi-directional data channel. The cable may be a coaxial cable, and may be configured to carry DC power and to form a bi-directional link, such as an FPD-link. For example, the bi-directional link may have a 4 Gbps forward channel and a 25 MHz backwards channel. The cable has a first end 101 and a second end 103. The first end 101 may be connected to a first device, and the second end 103 may be connected to a second device, as described further below.

Positioned between the first end 101 and the second end 103 along the cable 102 and on a first physical layer 104 is a first pad 106. The first pad has a first volume. In some examples, the first volume of the first pad 106 comprises a rectangle-shaped face and height. The first physical layer 104 may be a surface layer of a printed circuit board. The surface layer may be an outermost surface of the printed circuit board that includes portions that are of electrically conductive material, such as copper. The portions of electrically conductive material may form pads and traces.

The first pad 106 may be a PoDL pad, or a stub, that is connected to a DC power source 108 and configured to transmit power from the DC power source along the power channel. The DC power source 108 may be configured to provide, for example, 48V of DC power. In some implementations, the DC power source 108 may be a battery, a fuel cell, an alternator, a generator, or a combination of two or more of these. For example, the DC power source 108 may be both an alternator and a battery of a vehicle, where the PoDL may be configured to utilize the alternator of the vehicle as the DC power source when the vehicle's engine is running and the battery of the vehicle as the DC power source when the vehicle's engine is not running.

To provide low impedance for the power channel and high impedance for the data channel, one or more circuitry elements 110 may be connected between the first pad and the DC power source. These one or more circuitry elements 110 may be one or more inductors, one or more ferrite beads, or both.

A second pad 112 may be positioned along the cable 102, in series with the first pad 106, and on the same first physical layer 104 as the first pad 106. The second pad 112 may have a second volume larger than the first volume. In some examples, the second pad 112 has a larger rectangle-shaped face than and a same or similar height as the first pad 106. The second pad 112 is an alternating current (AC) capacitor pad that is configured to transmit and receive data on an AC signal along the data channel. When the first pad 106 and the second pad 112 are linked in series on the same first physical layer 104, there may be a smaller discontinuity at the first pad 106 than when the first pad 106 and the second pad 112 are on two different layers that are connected by a via.

As shown in FIG. 1, a second physical layer 114 may be positioned on one side of the first physical layer 104 opposite of a side on which the first pad 106 and the second pad 112 are placed or underneath the first physical layer 104. The second physical layer 114 may be a ground plane. The ground plane may be an electrically conductive surface, such as copper, that is connected to an electrical ground. One or more points on the first physical layer 104 may be connected to the second physical layer 114 to allow current to flow from the first physical layer 104 to the second physical layer 114.

As further shown in FIG. 1, there is a cutout 116 in the second physical layer 114. The first pad 106 and/or the second pad 112 may be positioned over the cutout 116 such that the first pad 106 and/or the second pad 112 are within an area covered by the cutout.

The size of the cutout 116 may be determined based on the impedance before and after the first and second pads 106, 112. As shown in FIG. 1, a first location 118 that is between the first end 101 of the cable 102 and the cutout 116 may be before the first and second pads 106, 112, and a second location 120 that is between the cutout 116 and the second end 103 of the cable 102 may be after the first and second pads 106, 112. For example, the size of the cutout 116 may be determined such that an impedance at the circuitry elements within the cutout 116, such as the first or second pads, matches or closely matches an impedance before and after the cutout. For example, the impedance at the circuitry may be within +/−2% of the impedance before and after the cutout where possible, or in some cases within greater than +/−2% of the impedance before and after the cutout wherein possible. In addition, the size of the first pad or the second pad may be used to estimate the impedance at each pad, respectively. As such, when the impedance before and after the cutout is, for example, 50 ohms, the size of the cutout may be determined such that the impedance at the first and second pads 106, 112 is at or close to 50 ohms, such as 48 or 49 ohms.

Figure 2:
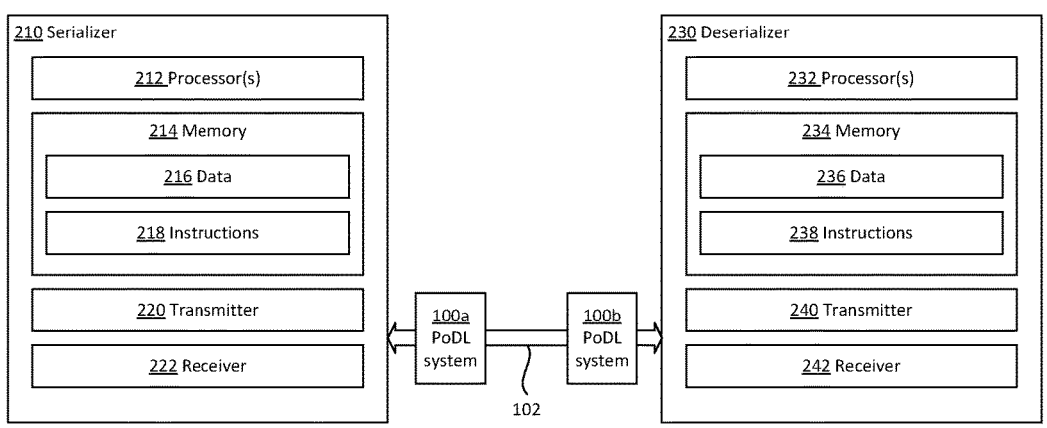
FIG. 2 is a functional diagram of a communication system 200 in accordance with aspects of the disclosure.

One or more PoDL systems may be included in a communication system to connect two computing devices via the data channel. Data received from a first computing device may be transmitted to a second computing device along the data channel, as well as from the second computing device to the first computing device, while DC power from a DC power source is transmitted along the power channel FIG. 2 shows a communication system 200 that includes two PoDL systems 100a, 100b. PoDL system 100a is connected to a serializer 210, and PoDL system 100b is connected to a deserializer 230. PoDL system 100b may include the DC power source 108, as shown in FIG. 1, while PoDL system 100a may not include the DC power source. In some examples, the PoDL system 100a may include a storage cell, such as a battery, configured to store energy received from the DC power source 108 of the PoDL system 100b. The cable 102 connects the serializer 210, the PoDL system 100a, the PoDL system 100b, and the deserializer 230 in sequence.

The serializer 210 may be a computing device that is configured to convert an object, such as an image, into a data stream. In some implementations, the serializer 210 may be part of a sensing device or may be configured to communicate with a sensing device, such as a camera. As shown in FIG. 2, the serializer 210 may include one or more processors 212, a memory 214, a transmitter 220, and a receiver 222. The sensing device may alternatively be or include one or more other types of sensors, such as lidar, radar, or sonar.

The one or more processors 212 may be any conventional processors, such as commercially available CPUs. Alternatively, the one or more processors may be a dedicated device such as an application specific integrated circuit (ASIC) or other hardware-based processor, such as a field programmable gate array (FPGA). Although FIG. 2 functionally illustrates the one or more processors 212 and memory 214 as being within the same block, it will be understood that the one or more processors 212 and memory 214 may actually comprise multiple processors and memories that may or may not be stored within the same physical housing. Accordingly, references to a processor or computer or computing device will be understood to include references to a collection of processors or computers or memories that may or may not operate in parallel.

Memory 214 stores information accessible by the one or more processors 212, including data 216, and instructions 218 that may be executed by the one or more processors 212. Information that may be stored at the memory 214 includes data received via the PoDL system 100a that is connected to the serializer 210. The memory 214 may be of any type capable of storing information accessible by the processor, including a computer-readable medium such as a hard-drive, memory card, ROM, RAM, DVD or other optical disks, as well as other write-capable and read-only memories. The system and method may include different combinations of the foregoing, whereby different portions of the data 216 and instructions 218 are stored on different types of media.

Data 216 may be retrieved, stored or modified by the one or more processors 212 in accordance with the instructions 218. For instance, although the system and method is not limited by any particular data structure, the data 216 may be stored in computer registers, in a relational database as a table having a plurality of different fields and records, XML documents or flat files. The data 216 may also be formatted in any computer-readable format such as, but not limited to, binary values or Unicode. By further way of example only, image data may be stored as bitmaps comprised of grids of pixels that are stored in accordance with formats that are compressed or uncompressed, lossless (e.g., BMP) or lossy (e.g., JPEG), and bitmap or vector-based (e.g., SVG), as well as computer instructions for drawing graphics. The data 216 may comprise any information sufficient to identify the relevant information, such as numbers, descriptive text, proprietary codes, references to data stored in other areas of the same memory or different memories (including other network locations) or information that is used by a function to calculate the relevant data.

The instructions 218 may be any set of instructions to be executed directly (such as machine code) or indirectly (such as scripts) by the one or more processors 212. For example, the instructions 218 may be stored as computer code on the computer-readable medium. In that regard, the terms "instructions" and "programs" may be used interchangeably herein. The instructions 218 may be stored in object code format for direct processing by the one or more processors 212, or in any other computer language including scripts or collections of independent source code modules that are interpreted on demand or compiled in advance. Functions, methods and routines of the instructions 218 are explained in more detail below.

The one or more processors 212 may also be in communication with the transmitter 220 and the receiver 222. Transmitter 220 and receiver 222 may be part of a transceiver arrangement in the serializer 210. The one or more processors 212 may therefore be configured to transmit, via the transmitter 220, data in a signal along cable 102, and also may be configured to receive, via the receiver 222, data in a signal along cable 102. Received signal may be processed by the one or more processors 212 to extract the data. In some implementations the transmitter 220 may also be configured to transmit data to another computing device via another cable or a wireless network.

Deserializer 230 may be configured to receive a data stream and reconstruct an object from the data stream. Once the object is reconstructed, the deserializer 230 may store the object or transmit the object to a next destination.

The deserializer 230 may be remote from the serializer 210. For example, the serializer 210 may be a part of or connected to a sensing system, such as a camera system, mounted on a top of a vehicle, such as a passenger vehicle, a truck, a bicycle, etc., and the deserializer 230 may be in the interior of the vehicle. In some implementations, the sensing system may include one or more sensors configured to move, for instance by rotating, relative to the vehicle in order to collect data in the environment of the vehicle. When there are one or more moving sensors in the sensing system, the first end 101 of the cable 102 may be connected to a portion of the sensing system that is stationary, such as a central axis or an outer structure. Alternatively, the first end 101 of cable 102 may be connected to a portion of the one or more sensors that rotate. In addition, the first end 101 may even include a rotary joint to allow the first end 101 to rotate with the one or more sensors while other portions of the cable remain more or less stationary relative to the one or more sensors.

The deserializer 230 may include one or more processors 232, a memory 234, a transmitter 240, and a receiver 242. The one or more processors 232 may be similar to the one or more processors 212 described above. Memory 234 may store information accessible by the one or more processors 232, including data 236 and instructions 238 that may be executed by the one or more processors 232. Memory 234, data 236, and instructions 238 may be configured similarly to memory 214, data 216, and instructions 218 described above. In addition, the deserializer 230 may be configured to transmit and receive communication signals via cable 102 using the transmitter 240 and the receiver 242. The transmitter 240 and the receiver 242 may be configured similarly to the transmitter 220 and the receiver 222 described above.

Figure 3:
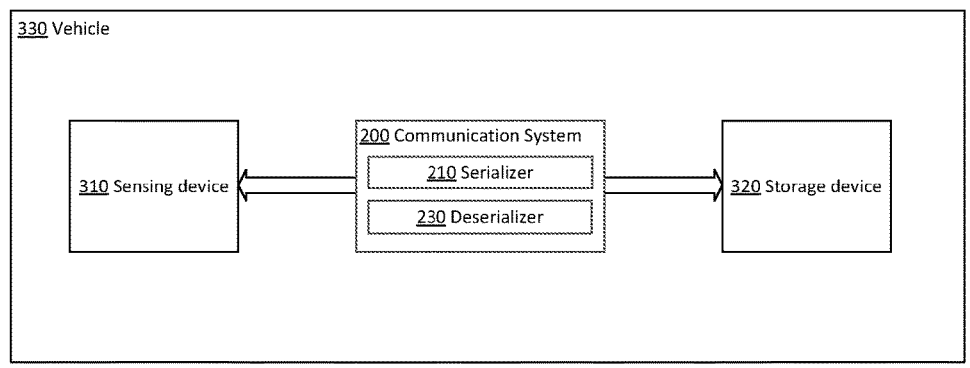
FIG. 3 is a functional diagram of a system 300 in accordance with aspects of the disclosure.
Figure 4:
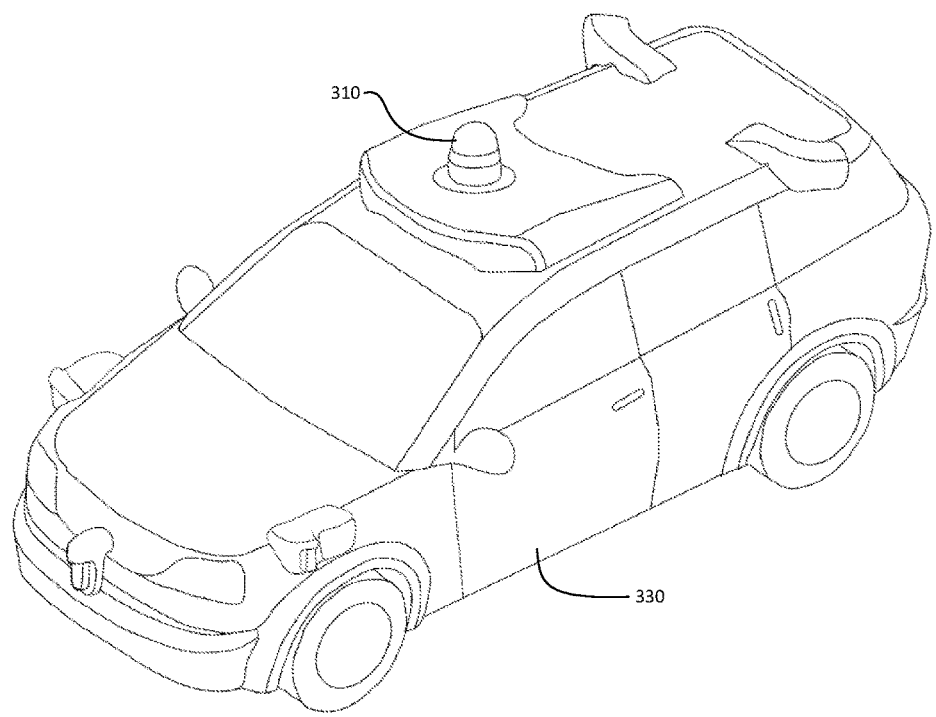
FIG. 4 is a pictorial diagram of a system 300 in accordance with aspects of the disclosure.

As shown in FIG. 3, device 310 may be a sensing device and device 320 may be a storage device. The sensing device 310 may include a camera configured to capture images, a radar sensor that is configured to collect location data, a lidar sensor configured to collect location data, or any other type of sensor configured to collect information a location. The information collected by the sensing device 310 may be transmitted to the serializer 210 to be converted to a data stream to be sent along the cable 102 of communication system 200 to the deserializer 230. The deserializer 230 may then transmit the information to the storage device 320. In some examples, the deserializer 230 may reconstruct the information from the data stream prior to transmitting the information to the storage device 320.

The storage device 320 may store the information that may be retrieved or otherwise accessed by a server or client computing device for processing or display. As with memory 214, storage device 320 can be of any type of computerized storage capable of storing information accessible by the server computing devices 310, such as a hard-drive, memory card, ROM, RAM, DVD, CD-ROM, write-capable, and read-only memories. In addition, storage device 320 may include a distributed storage system where data is stored on a plurality of different storage devices which may be physically located at the same or different geographic locations. Storage device 320 may be connected to the server or client computing device via a wireless network and/or may be directly connected to or incorporated into any of the deserializer 230, the server computing device, or the client computing device. The storage device 320 may store objects, such as images captured by the sensing device 310 and transmitted using the communication system 200. Information associated with images such as location information and pose information may be stored in association with the images.

As shown in FIG. 3, the sensing device 310, communication system 200, and storage device 320 may be included in a vehicle 330. The sensing device 310, with the serializer 210, may be mounted on top of the vehicle 330, and the storage device 320, with the deserializer 230, may be positioned in the interior of the vehicle 330. As also described above, a battery of the vehicle 330 may be the DC power source 108 of the PoDL system 100b that is connected to the deserializer 230.

In an alternative example, device 320 may be a client computing device, such as a desktop computer system, a wireless phone, or a wearable computing system. The client computing device may include one or more processors, memory, data and instructions. Such processors, memories, data and instructions may be configured similarly to one or more processors 212, memory 214, data 216, and instructions 218 of serializer 210 as described above.

Example Methods

Figure 5:
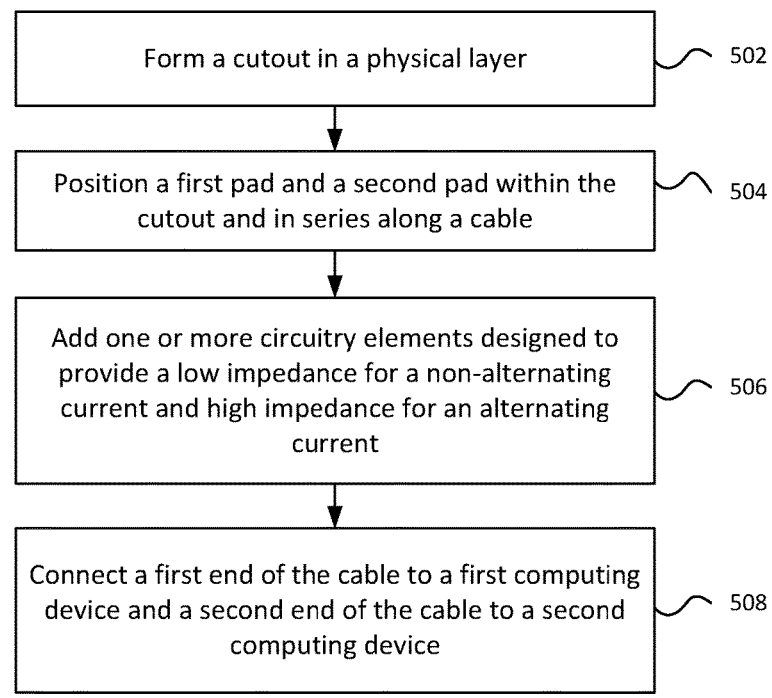
FIG. 5 is an example flow diagram 500 in accordance with aspects of the disclosure.

In FIG. 5, flow diagram 500 depicts a method of manufacture of some of the aspects described above. While FIG. 5 shows blocks in a particular order, the order may be varied and that multiple operations may be performed simultaneously. Also, operations may be added or omitted.

At block 502, a cutout may be formed in a physical layer of a circuit board, such as cutout 116 in the second physical layer 114. The cutout in the physical layer may be formed as part of the fabrication process of the circuit board. For example, when the physical layer is the ground plane, a portion of the electrically conductive surface that forms the ground plane may be removed, such as by etching, in order to form the cutout before any other physical layers, such as the first physical layer 104, masks, or finishes are added to the circuit board. The size of the cutout may be determined such that an impedance at the circuitry elements in proximity to the cutout, such as the first or second pads 106, 112 on the first physical layer, matches or closely matches an impedance before and after the cutout. The size of the cutout may be determined to be at least as big as an area covered by the first and/or second pads, so that the first pad, the second pad, or both may fit within the cutout. The size may be determined to be slightly greater than the area, such as wider or taller by one or two millimeters or more or less, for instance. For example, if the first and second pads cover about a 20 millimeter by 20 millimeter area, the size of the cutout may be 22 millimeters by 22 millimeters. Simulations may be performed to determine the size such that the impedance at the circuitry most closely matches the impedance before and after the cutout. In addition or in the alternative, the size of the first pad or the second pad may be used to estimate the impedance at each pad, respectively, which may be used to determine the size of the cutout as discussed above.

At block 504, a first pad and a second pad, such as first pad 106 and second pad 112, may be formed in series along a cable, such as cable 102, on another physical layer and at a location on the other physical layer within the area covered by the cutout. The other physical layer may be the first physical layer 104, which may be added over the second physical layer 114. In some examples, the first physical layer 104 may be copper foil overlaid on the second physical layer 114 using an epoxy material, such as fiberglass. The copper foil of the first physical layer 104 may be etched to form the first pad, the second pad, and the cable. The first pad may be a PoDL pad that is connected to a DC power source, such as DC power source 108, and the second pad may be an AC capacitor pad. In some alternatives, only the first pad or the second pad may be positioned within the cutout area.

At block 506, one or more circuitry elements that are designed to provide low impedance for a non-alternating current and high impedance for an alternating current, such as one or more circuitry elements 110, may be connected to the first pad. The one or more circuitry elements may include one or more inductors, one or more ferrite beads, or both.

At block 508, a first end of the cable may be connected to a first computing device, and a second end of the cable may be connected to a second computing device. The first computing device may be a serializer, such as serializer 210, and the second computing device may be a deserializer, such as deserializer 230.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A system comprising:
   a ground plane including a cutout;
   an alternating current (AC) capacitor pad configured to establish a bi-directional data channel, the AC capacitor pad being positioned in the cutout of the ground plane; and
   a power over data line (PoDL) pad connected to a plurality of inductors and a DC power source, the PoDL pad being positioned in the cutout of the ground plane and being in series with the AC capacitor pad.

2. The system of claim 1, further comprising the DC power source.

3. The system of claim 1, further comprising a cable connecting the AC capacitor pad and the PoDL pad in series, the cutout of the ground plane being located between a first end of the cable and a second end of the cable.

4. The system of claim 3, further comprising one or more computing devices at the first end of the cable, the one or more computing devices being configured to transmit data at a rate of 4 Gbps or greater along the bi-directional data channel.

5. The system of claim 4, wherein the one or more computing devices are a serializer.

6. The system of claim 3, further comprising one or more computing devices at the second end of the cable, the one or more computing devices being configured to process data received via the bi-directional data channel.

7. The system of claim 6, wherein the one or more computing devices are a deserializer.

8. The system of claim 3, wherein the cutout has a size wherein an impedance at the AC capacitor pad and the PoDL pad within the cutout match or closely match an impedance at a point of the cable that is between the first end of the cable and the cutout.

9. The system of claim 1, wherein the cutout has a size wherein an impedance at the AC capacitor pad and the PoDL pad within the cutout match or closely match an impedance at a point of the cable that is between the cut out and the second end of the cable.

10. The system of claim 1, further comprising a camera system configured to collect an image and transmit the image via the AC capacitor pad.

11. The system of claim 10, further comprising a vehicle, and wherein the camera system is mounted on the vehicle.

12. The system of claim 1, further comprising a lidar system configured to collect location information and transmit the location information via the AC capacitor pad.

13. The system of claim 12, further comprising a vehicle, and where the lidar system is mounted on the vehicle.

14. The system of claim 1, further comprising a layer beneath the ground plane, wherein the AC capacitor pad and the PoDL pad are positioned on the layer within the cutout of the ground plane.

15. A method of manufacturing comprising:
   forming a cutout in a ground plane;
   positioning in the cutout an alternating current (AC) capacitor pad configured to establish a bi-directional data channel; and
   positioning, in the cutout, a power over data line (PoDL) pad in series with the AC capacitor pad on a cable and in connection with a plurality of inductors and a DC power source.

16. The method of claim 15, further comprising connecting a first end of the cable to a first computing device and a second end of the cable to a second computing device, wherein the cutout is positioned between the first end and the second end of the cable.

17. The method of claim 16, wherein the first computing device are a serializer.

18. The method of claim 16, wherein the second computing device are a deserializer.

19. The method of claim 15, wherein the cutout has a size wherein an impedance at the AC capacitor pad and the PoDL pad within the cutout match or closely match an impedance at a point of the cable that is between the first end of the cable and the cutout.

20. The method of claim 15, wherein the cutout has a size wherein an impedance at the AC capacitor pad and the PoDL pad within the cutout match or closely match an impedance at a point of the cable that is between the cutout and the second end of the cable.

* * * * *

UNITED STATES PATENT AND TRADEMARK OFFICE
CERTIFICATE OF CORRECTION

PATENT NO. : 10,447,959 B2  
APPLICATION NO. : 15/817976  
DATED : October 15, 2019  
INVENTOR(S) : Huihui Hu and Min Wang Page 1 of 1

It is certified that error appears in the above-identified patent and that said Letters Patent is hereby corrected as shown below:

In the Claims

Claim 9
Column 9, Line 12:
Now reads: "The system of claim 1,"; should read -- the system of claim 3, --

Signed and Sealed this
Fourth Day of February, 2020

Andrei Iancu
*Director of the United States Patent and Trademark Office*